United States Patent
Zitzlsperger

(10) Patent No.: US 11,837,688 B2
(45) Date of Patent: Dec. 5, 2023

(54) PIXEL, MULTI-PIXEL LED MODULE AND METHOD OF MANUFACTURE

(71) Applicant: OSRAM OLED GmbH, Regensburg (DE)

(72) Inventor: Michael Zitzlsperger, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 17/051,127

(22) PCT Filed: May 8, 2019

(86) PCT No.: PCT/EP2019/061850
§ 371 (c)(1),
(2) Date: Oct. 27, 2020

(87) PCT Pub. No.: WO2019/215245
PCT Pub. Date: Nov. 14, 2019

(65) Prior Publication Data
US 2021/0050499 A1    Feb. 18, 2021

(30) Foreign Application Priority Data
May 9, 2018  (DE) .................. 10 2018 111 175.4

(51) Int. Cl.
| | |
|---|---|
| *H01L 27/15* | (2006.01) |
| *H01L 29/26* | (2006.01) |
| *H01L 31/12* | (2006.01) |
| *H01L 33/00* | (2010.01) |
| *H01L 33/62* | (2010.01) |

(Continued)

(52) U.S. Cl.
CPC .......... *H01L 33/62* (2013.01); *H01L 25/0753* (2013.01); *H01L 25/167* (2013.01); *H01L 27/156* (2013.01); *H01L 33/005* (2013.01)

(58) Field of Classification Search
CPC ... H01L 33/62; H01L 25/0753; H01L 25/167; H01L 27/156; H01L 33/005
See application file for complete search history.

(56) References Cited

U.S. PATENT DOCUMENTS

| | | | |
|---|---|---|---|
| 10,418,515 B2 * | 9/2019 | Wicke | ..................... H01L 33/56 |
| 10,510,935 B2 | 12/2019 | Richter | |

(Continued)

FOREIGN PATENT DOCUMENTS

| | | |
|---|---|---|
| CN | 203707120 U | 7/2014 |
| DE | 102009047889 A1 | 3/2011 |

(Continued)

*Primary Examiner* — Ismail A Muse
(74) *Attorney, Agent, or Firm* — Slater Matsil, LLP

(57) ABSTRACT

In an embodiment a pixel for a multi-pixel LED module includes a first light-emitting semiconductor chip having a first upper chip side and a first lead-frame section having a first upper side, a first contacting protrusion and a second contacting protrusion, wherein the first contacting protrusion and the second contacting protrusion extend from the first upper side, and wherein the first light-emitting semiconductor chip is embedded in an electrically insulating material such that the first upper side is covered by the electrically insulating material and the first upper chip side and the contacting protrusions are exposed.

19 Claims, 11 Drawing Sheets

(51) Int. Cl.
*H01L 25/075* (2006.01)
*H01L 25/16* (2023.01)

(56) References Cited

U.S. PATENT DOCUMENTS

| | | | | |
|---|---|---|---|---|
| 2005/0190561 | A1* | 9/2005 | Ng | H01L 33/54 |
| | | | | 257/E33.059 |
| 2010/0044723 | A1* | 2/2010 | Yamamoto | G02B 6/4214 |
| | | | | 257/82 |
| 2012/0037929 | A1* | 2/2012 | Ramchen | H01L 24/34 |
| | | | | 257/E33.059 |
| 2012/0299049 | A1 | 11/2012 | Rode et al. | |
| 2013/0207145 | A1* | 8/2013 | Schneider | H01L 33/60 |
| | | | | 257/98 |
| 2014/0217444 | A1* | 8/2014 | Keith | H01L 33/56 |
| | | | | 438/27 |
| 2015/0207050 | A1* | 7/2015 | Tsukada | H01L 23/13 |
| | | | | 257/784 |
| 2016/0056344 | A1* | 2/2016 | Reill | H01L 33/54 |
| | | | | 438/27 |
| 2016/0225964 | A1* | 8/2016 | Schwarz | H01L 33/62 |
| 2017/0338384 | A1* | 11/2017 | Schwarz | H01L 33/486 |
| 2018/0150673 | A1* | 5/2018 | Ng | H01L 23/49551 |
| 2019/0296522 | A1* | 9/2019 | Johnson | H01S 5/02253 |
| 2020/0313053 | A1* | 10/2020 | Daeschner | H01L 23/495 |
| 2020/0402943 | A1* | 12/2020 | Hien | H01L 25/0753 |

FOREIGN PATENT DOCUMENTS

| | | |
|---|---|---|
| DE | 102014117435 A1 | 6/2016 |
| DE | 102018101813 A1 | 8/2019 |
| JP | 2001111119 A | 4/2001 |
| WO | 2017060280 A1 | 4/2017 |

* cited by examiner

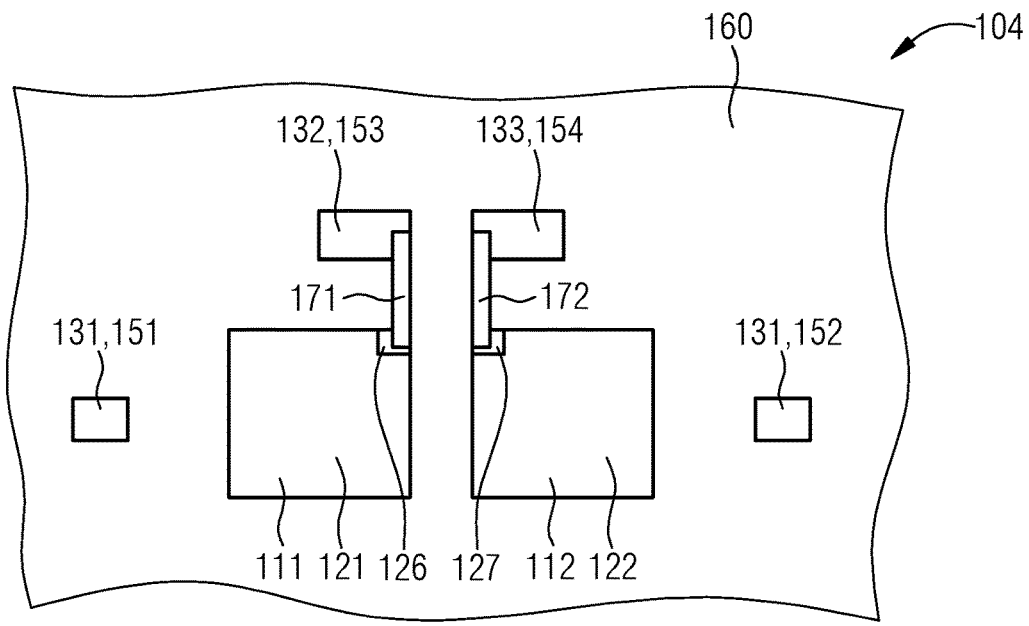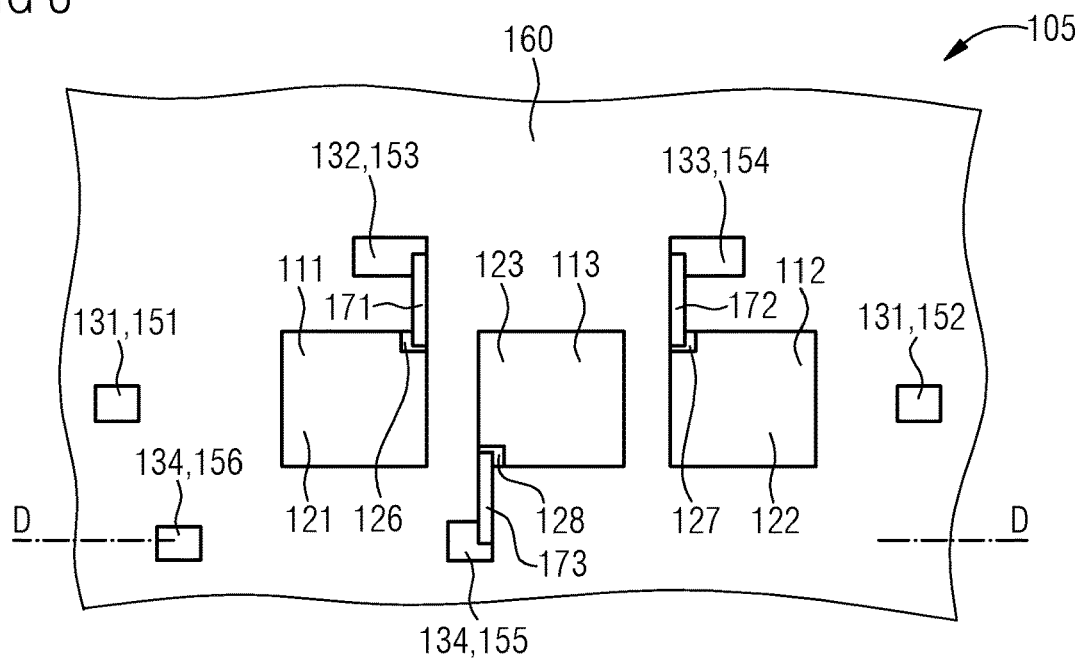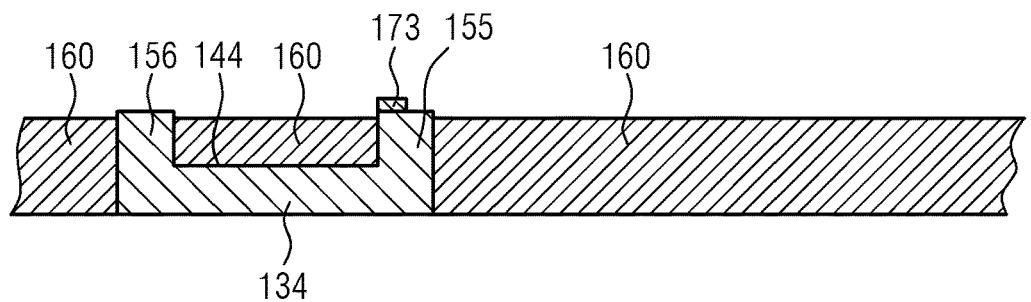

PIXEL, MULTI-PIXEL LED MODULE AND METHOD OF MANUFACTURE

This patent application is a national phase filing under section 371 of PCT/EP2019/061850, filed May 8, 2019, which claims the priority of German patent application 102018111175.4, filed May 9, 2018, each of which is incorporated herein by reference in its entirety.

TECHNICAL FIELD

The present invention relates to a pixel for a multi-pixel LED module, to a multi-pixel LED module and to a manufacturing method for a pixel or a multi-pixel LED module.

BACKGROUND

Multi-pixel LED modules may be equipped with a so-called cross-matrix circuit, in which a voltage may be applied to a first terminal for a column of pixels and to a second terminal for a row of pixels, and thus a pixel or a light-emitting semiconductor chip of a pixel may be supplied with the applied voltage. If the connections of the rows and columns are now switched through, all pixels may be controlled one after the other. Such a cross-matrix circuit may be realized by conductor paths on a first level of a circuit board, wherein current paths are led to a second level of the circuit board by means of vias to avoid short circuits at the crossing points. This renders the multi-pixel LED modules very complex.

SUMMARY

Embodiments provide a pixel for a multi-pixel LED module which is simpler in configuration. Further embodiments provide a multi-pixel LED module. Yet further embodiments provide methods to manufacture a pixel or a multi-pixel LED module.

A pixel for a multi-pixel LED module comprises a first light-emitting semiconductor chip with a first upper chip side and a first lead-frame section. The first lead-frame section has a first upper side and a first contacting protrusion as well as a second contacting protrusion, the contacting protrusions extending from the first upper side. The first light-emitting semiconductor chip is embedded in an electrically insulating material in such a way that the first upper side is covered by the electrically insulating material and the first upper chip side and the contacting protrusions are exposed.

Thus, on the one hand, the first upper chip side may be electrically contacted and on the other hand, a first bottom chip side adjacent to the first upper side may be electrically contacted via the first lead-frame and the contacting protrusions. Pixels arranged next to one another in a first direction may be connected to one another via the contacting protrusions. In a second direction, adjacent pixels may be directly connected to one another, wherein said connection may be guided across the electrically insulating material. This allows for a cross-matrix circuit.

In an embodiment, the light-emitting semiconductor chip is arranged on the first upper side.

In another embodiment, the pixel has a second lead-frame section which has a second upper side and a third contacting protrusion extending from the second upper side. The electrically insulating material covers the second upper side. A first conductive layer is deposited on the electrically insulating material in such a way that the first conductive layer connects the first upper chip side to the third contacting protrusion. This allows for the pixel to be contacted via the second lead-frame section.

In an embodiment, the pixel comprises a second light-emitting semiconductor chip having a second upper chip side which is arranged on the first upper side and is embedded in the electrically insulating material in such a way that the second upper chip side is exposed. This allows for producing a two-colour pixel.

In another embodiment, the pixel comprises a third lead-frame section which has a third upper side and a fourth contacting protrusion extending from the third upper side. The third upper side is covered by electrically insulating material. A second conductive layer is deposited on the electrically insulating material in such a way that the second conductive layer connects the second upper chip side to the fourth contacting protrusion.

In an embodiment, the pixel comprises a third light-emitting semiconductor chip with a third upper chip side and a fourth lead-frame section. The third light-emitting semiconductor chip is located on the first upper side. The fourth lead-frame section has a fourth upper side and a fifth contacting protrusion and a sixth contacting protrusion, the fourth upper side being covered with electrically insulating material. A third conductive layer is deposited on the electrically insulating material in such a way that the third conductive layer connects the third upper chip side to the fifth contacting protrusion.

In an embodiment, the pixel comprises a fourth light-emitting semiconductor chip having a fourth upper chip side and a fifth lead-frame section. The fourth light-emitting semiconductor chip is located on the first upper side. The fifth lead-frame section has a fifth upper side and a seventh contacting protrusion as well as an eighth contacting protrusion, the fifth upper side being covered by the electrically insulating material. A fourth conductive layer is applied to the electrically insulating material in such a way that the fourth conductive layer connects the fourth upper chip side to the seventh contacting protrusion.

In an embodiment, the first light-emitting semiconductor chip is arranged on a second upper side of a second lead-frame section, the second lead-frame section having a third contacting protrusion, the upper chip side being connected to the first contacting protrusion by means of an electrically conductive layer.

A multi-pixel LED module comprises a first column of pixels arranged in a first direction, the pixels being embodied in one of the described embodiments. A first conductive path and/or a second conductive path and/or a third conductive path and/or a fourth conductive path is/are guided continuously along the first direction across the first column of pixels. The number of conductive paths corresponds to the number of light-emitting semiconductor chips. The first conductive path may be connected to the first light-emitting semiconductor chip or the third contacting protrusion. The second conductive path may be connected to the second light-emitting semiconductor chip or to the fourth contacting protrusion. The third conductive path may be connected to the sixth contacting protrusion. The fourth conductive path may be connected to the eighth contacting protrusion. Such an arrangement allows for a column of pixels which may be integrated into a cross-matrix circuit.

In an embodiment of the multi-pixel LED module, one or more of the conductive paths are arranged between the first contacting protrusions and the second contacting protrusions of the pixels. This allows further columns of these pixels to be contacted by means of the first and second contacting protrusions.

In an embodiment, the multi-pixel LED module comprises further columns of pixels arranged in the first direction, which are identical to the first column of pixels. The first contacting protrusions and the second contacting protrusions are at least partially connected via fifth conductive layers, the fifth conductive layers being arranged on the electrically insulating material.

In an embodiment of the multi-pixel LED module, the first lead-frame sections of the pixels are each interconnected by means of a sixth conductive layer between two columns of pixels, the sixth conductive layers being arranged on the first upper surfaces opposite to the bottom sides of the first lead-frame sections.

A method of manufacturing a pixel comprises the following steps: providing a first lead-frame section having a first upper side and a first contacting protrusion and a second contacting protrusion, the first contacting protrusion and the second contacting protrusion extending from the first upper side; arranging a first light-emitting semiconductor chip on an upper side of a lead-frame section; and embedding the first light-emitting semiconductor chip in an electrically insulating material in such a way that the first upper side is covered by the electrically insulating material and the first upper chip side and the contacting protrusions are exposed.

In an embodiment of the inventive method, the first light-emitting semiconductor chip is arranged on the first upper side. In another embodiment of the inventive method, the first light-emitting semiconductor chip is mounted on a second upper side of a second lead-frame section.

In an embodiment of the inventive method, further lead-frame sections with further contacting protrusions are provided and/or further light-emitting semiconductor chips are arranged on the first surface and embedded in the electrically insulating material.

In an embodiment of the inventive method, further pixels are arranged in a first column and a first conductive path is arranged on the electrically insulating material along the first column so that the first conductive path is bonded to the first upper chip sides.

In an embodiment of the inventive method, further columns of pixels are arranged adjacent to the first column of pixels to form a multi-pixel LED module, wherein the first contacting protrusions and the second contacting protrusions are at least partially interconnected via fifth conductive layers. The fifth conductive layers are thereby arranged on the electrically insulating material.

In an embodiment of the inventive method, defective pixels are identified by means of a test procedure. A column of pixels containing a defective pixel is removed from the multi-pixel LED module, thereby creating a separation point. The remaining columns of the multi-pixel LED module are then pushed together and the first lead-frame sections are connected to each other at the separation point. Alternatively, a further independently produced column of pixels may be inserted into the gap created by removing the column.

The connection may be carried out by means of sixth conductive layers. The sixth conductive layers are applied to a bottom side of the first lead-frame sections opposite the first upper sides. Alternatively, the connection may be provided by soldering or bonding wires. This allows pixel errors to be compensated for during the manufacture of the multi-pixel LED module.

BRIEF DESCRIPTION OF THE DRAWINGS

The properties, features and advantages of the present invention described above, as well as the manner in which they are achieved, become clearer and more understandable in connection with the following description of the embodiment examples, which are explained in more detail in connection with the drawings.

FIG. 7 shows a fourth pixel;
FIG. 8 shows a fifth pixel;
FIG. 9 shows a cross-section through the fifth pixel.

DETAILED DESCRIPTION OF ILLUSTRATIVE EMBODIMENTS

Figure 1:
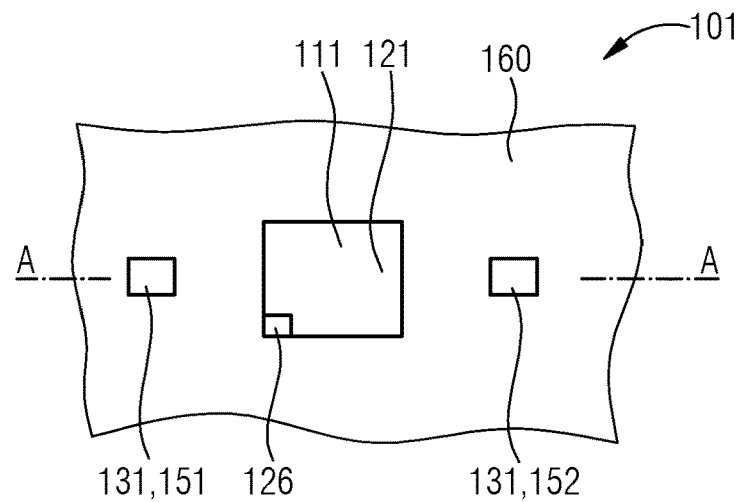
FIG. 1 shows a first pixel.

FIG. 1 shows a top view of a first pixel 101. Between a first contacting protrusion 151 and a second contacting protrusion 152 a first light-emitting semiconductor chip 111 is arranged, the first upper chip side 121 of which is visible. A first chip contact 126 is arranged on the upper chip side 121. The contacting protrusions 151, 152 are part of a first lead-frame section 131, wherein the first light-emitting chip 111 is arranged on the first lead-frame section 131.

Figure 2:
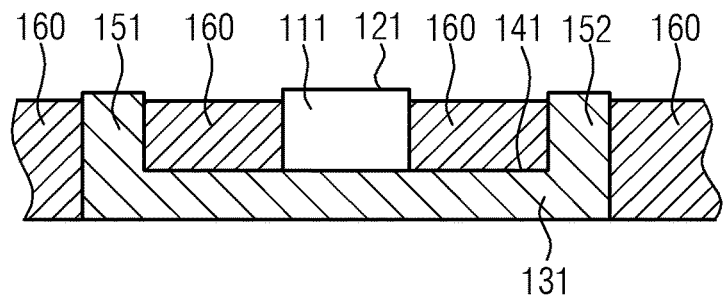
FIG. 2 shows a cross-section through the first pixel.

FIG. 2 shows a cross-section of the first pixel 101 of FIG. 1 along the sectional line marked A. The first light-emitting chip 111 is arranged on a first upper side 141 of the first lead-frame section 131 and embedded in an electrically insulating material 160 in such a way that the first upper side 141 is covered by the electrically insulating material 160 and the first upper chip side 121 and the contacting protrusions 151, 152 are exposed. The contacting protrusions 151, 152 start from the first upper side 141.

The first light-emitting semiconductor chip 111 may thus be electrically contacted via the first upper chip side 121 and the contacting protrusions 151, 152. In a cross-matrix circuit of several first pixels wo, a first current path may be guided via the contacting protrusions 151, 152 and the first lead-frame section 131. A second current path perpendicular to thereto may be guided on the electrically insulating material 160 so that the current paths do not touch each other.

Figure 3:
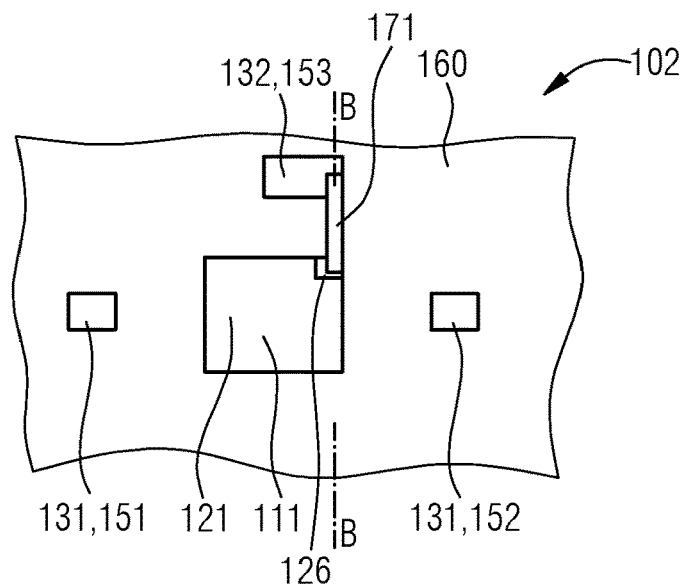
FIG. 3 shows a second pixel.

FIG. 3 shows a top view of a second pixel 102, which corresponds to the first pixel 101 of FIGS. 1 and 2 unless differences are described below. The second pixel 102 has a second lead-frame section 132 having a third contacting protrusion 153. The first chip contact 126 is connected to the third contacting protrusion 153 via a first conductive layer 171. The first lead-frame section 131 and the second lead-frame section 132 are electrically insulated from each other so that the first light-emitting semiconductor chip 111 may be electrically contacted via the first lead-frame section 131 and the second lead-frame section 132.

Figure 4:
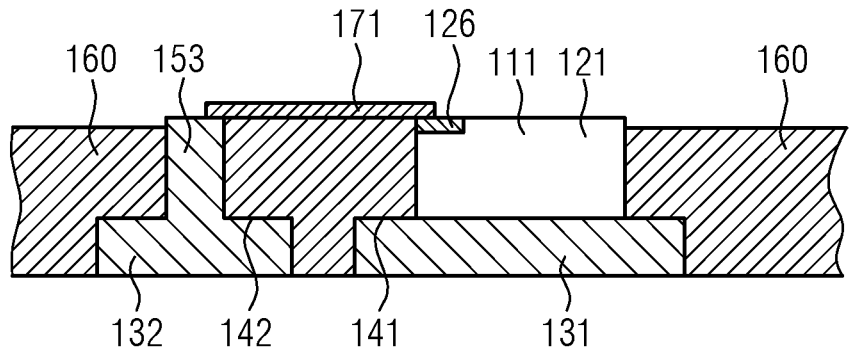
FIG. 4 shows a cross-section through the second pixel.

FIG. 4 shows a cross-section through the second pixel 102 of FIG. 3 along the sectional line marked B. The second lead-frame section 132 has a second upper side 142 from which the third contacting protrusion 153 originates. The electrically insulating material 160 covers the second upper side 142 and the third contacting protrusion 153 is exposed. The first light-emitting semiconductor chip 111 may thus be contacted via the third contacting protrusion 153. The insulating material 160 is arranged between the first lead-frame section 131 and the second lead-frame section 132 so that the first lead-frame section 131 and the second lead-frame section 132 are insulated from each other.

Figure 5:
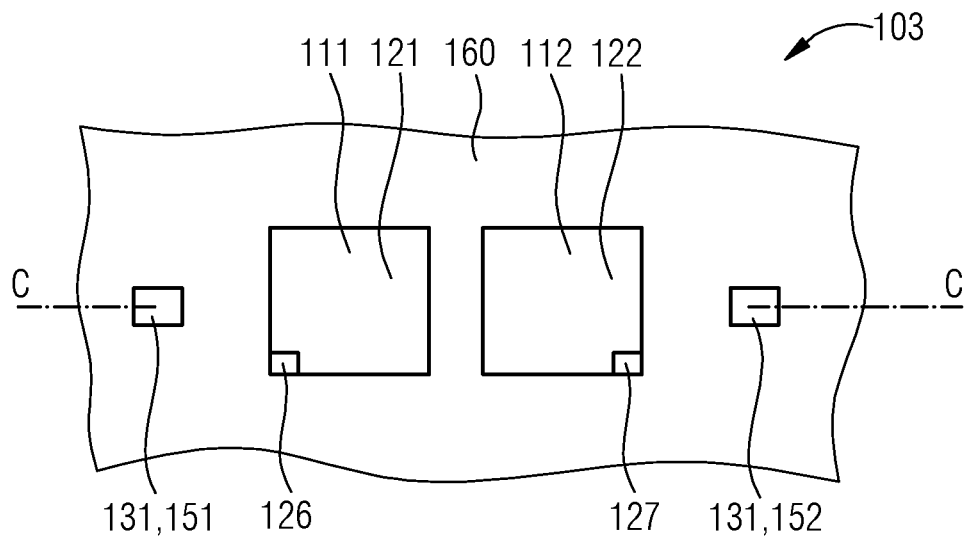
FIG. 5 shows a third pixel.

FIG. 5 shows a top view of a third pixel 103, which corresponds to the first pixel 101 of FIGS. 1 and 2, unless differences are described below. In addition to the first light-emitting semiconductor chip 111, a second light-emitting semiconductor chip 112 is arranged between the contacting protrusions 151, 152, which has a second upper chip side 122 and a second chip contact 127.

Figure 6:
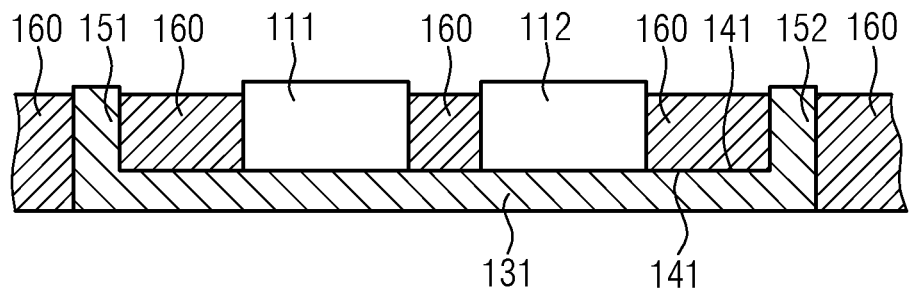
FIG. 6 shows a cross-section through the third pixel.

FIG. 6 shows a cross-section through the third pixel 103 of FIG. 5 along the sectional line marked C. The light-emitting semiconductor chips 111, 112 are arranged on the upper side 141 of the first chip frame section 131.

As an alternative to the depiction of FIGS. 5 and 6, the light-emitting semiconductor chips 111, 112 may also be arranged differently on the first lead-frame section 131, for example vertically next to each other instead of horizontally next to each other.

The first light-emitting semiconductor chip 111 may be electrically contacted via the first upper chip side 121 as well as the contacting protrusions 151, 152. The second light-emitting semiconductor chip 112 may be electrically contacted via the second upper chip side 122 and the contacting protrusions 151, 152. In a cross-matrix circuit of several third pixels 103, a first current path may be guided via the contacting protrusions 151, 152 and the first lead-frame section 131. A second current path perpendicular thereto and a third current path parallel to the second current path may be routed on the electrically insulating material 160 so that the current paths do not touch.

FIG. 7 shows a top view of a fourth pixel 104 which corresponds to the third pixel 103 of FIGS. 5 and 6, unless differences are described below. The fourth pixel 104 has a second lead-frame section 132 having a third contacting protrusion 153 analogously to the second pixel 102 of FIG. 3. The first chip contact 126 is connected to the third contacting protrusion 153 via a first conductive layer 171. In addition, the fourth pixel 104 has a third lead-frame section 133 with a fourth contacting protrusion 154. The third lead-frame section 133 is insulated from the first lead-frame section 131 or, respectively, from the second lead-frame section 132. The second chip contact 127 is connected to the fourth contacting protrusion 154 via a second conductive layer 172. The third contacting protrusion 153 and the fourth contacting protrusion are exposed.

The first light-emitting semiconductor chip 111 may be electrically contacted via the third contacting protrusion 153 as well as the first contacting protrusion 151 or the second contacting protrusion 152. The second light-emitting semiconductor chip 112 may be electrically contacted via the fourth contacting protrusion 154 as well as the first contacting protrusion 151 or the second contacting protrusion 152. In a cross-matrix circuit of several fourth pixels 104, a first current path may be guided via the contacting protrusions 151, 152 as well as the first lead-frame section 131. A second current path perpendicular thereto and a third current path parallel to the second current path may be guided on the electrically insulating material 160 so that the current paths do not touch.

The third lead-frame section has a third upper side which is embodied analogously to the second upper side 142 of the second lead-frame section 132. The fourth contacting protrusion 154 originates from the third upper side.

FIG. 8 shows a top view of a fifth pixel 105, which corresponds to the fourth pixel 104 of FIG. 7, unless differences are described below. In addition to the first light-emitting semiconductor chip in and the second light-emitting semiconductor chip 112, a third light-emitting semiconductor chip 113 is arranged. Further, the fifth pixel 105 has a fourth lead-frame section 134 which has a fifth contacting protrusion 155 and a sixth contacting protrusion 156. The fourth lead-frame section 134 is insulated from the first lead-frame section 131, the second lead-frame section 132, and the third lead-frame section 133, respectively. A third chip contact 128 is connected to the fifth contacting protrusion 155 via a third conductive layer 173.

FIG. 9 shows a cross-section through the fifth pixel 105 of FIG. 8 along the sectional line marked D. The fifth contacting protrusion 155 as well as the sixth contacting protrusion 156 originate from a fourth upper side 144 of the fourth lead-frame section. The fourth upper side 144 is covered by the electrically insulating material 160. The fifth contacting protrusion 155 and the sixth contacting protrusion 156 are exposed.

The first light-emitting semiconductor chip 111 may be electrically contacted via the third contacting protrusion 153 and the first contacting protrusion 151 or the second contacting protrusion 152. The second light-emitting semiconductor chip 112 may be electrically contacted via the fourth contacting protrusion 154 as well as the first contacting protrusion 151 or the second contacting protrusion 152. The third light-emitting semiconductor chip 113 may be electrically contacted via the sixth contacting protrusion 156 as well as the first contacting protrusion 151 or the second contacting protrusion 152. In a cross-matrix circuit of several fifth pixels 105, a first current path may be guided via the contacting protrusions 151, 152 and the first lead-frame section 131. A second current path perpendicular thereto and a third and fourth current path parallel to the second current path may be guided on the electrically insulating material 160 so that the current paths do not touch.

The fifth pixel 105 may have a red, a green and a blue light-emitting semiconductor chip and thus be used in an RGB display. Alternatively, other colors and combinations of colors are conceivable, as well. Furthermore, a chip may also be embodied as a photodiode, for example as a sensor for a touch-sensitive display.

Figure 10:
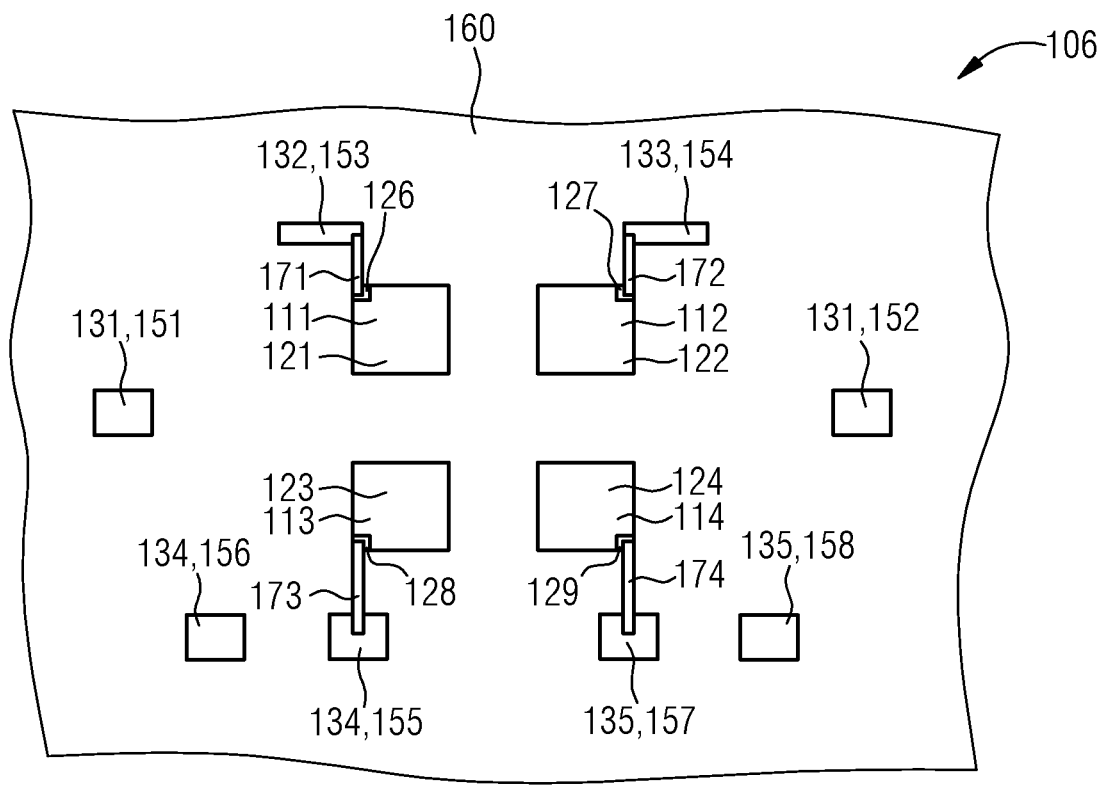
FIG. 10 shows a sixth pixel.

FIG. 10 shows a top view of a sixth pixel 106, which corresponds to the fifth pixel 105 of FIG. 7, unless differences are described in the following. The sixth pixel has a fourth light-emitting semiconductor chip 114. The light-emitting semiconductor chips 111, 112, 113, 114 are not arranged in a line but in a rectangle. The sixth pixel 106 has a fifth lead-frame section 135 having a seventh contacting protrusion 157 and an eighth contacting protrusion 158 which originate from a fifth upper side of the fifth lead-frame section. A fourth chip contact 129 arranged on a fourth upper chip side 124 of the fourth light-emitting semiconductor chip 114 is connected to the seventh contacting protrusion 157 via a fourth conductive layer 174.

Figure 11:
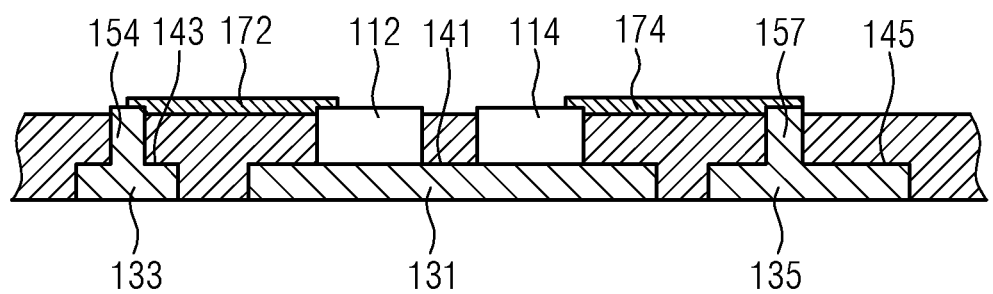
FIG. 11 shows a cross-section through the sixth pixel.

FIG. 11 shows a cross-section through the sixth pixel 106 of FIG. 10 along the sectional line marked E.

The third conductor frame section 133 comprises a third upper side 143. The fifth lead-frame section 135 has a fifth upper side 145. The fourth contacting protrusion 154 originates from the third upper side 143. The seventh contacting protrusion 157 and the eighth contacting protrusion 158 originate from the fifth upper side 145.

The sixth pixel 106 may have a red, a green, a blue and a white light-emitting semiconductor chip and may thus be used in an RGBW display. Alternatively, a red, a green and a blue light-emitting semiconductor chip and additionally a photodiode may be arranged in each pixel. Thus, a touch-sensitive RGB display may be provided.

Figure 12:
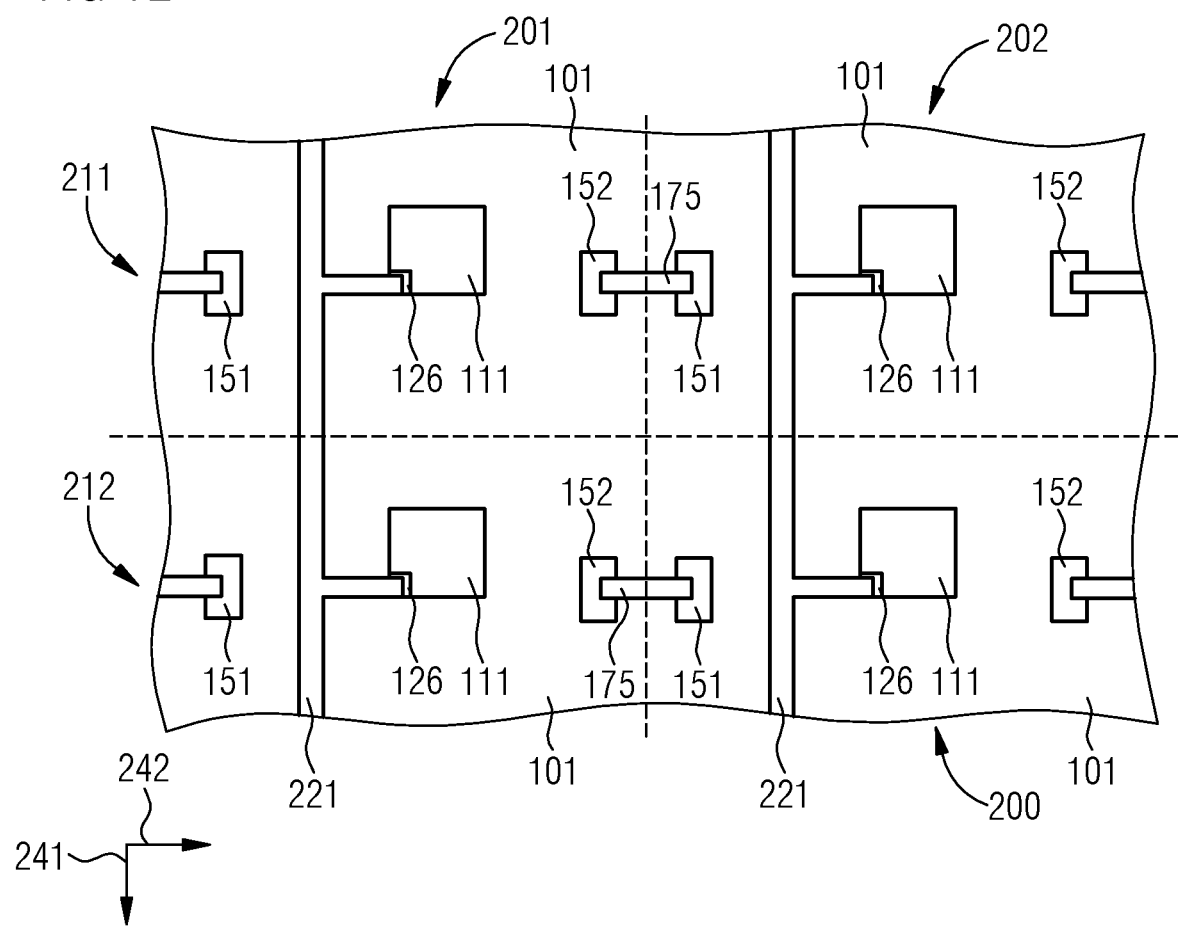
FIG. 12 shows a section of a multi-pixel LED module consisting of first pixels.

FIG. 12 shows a top view of a section of a multi-pixel LED module 200 with four first pixels 101 arranged in a rectangle within the section. Two first pixels 101 are thus arranged in a first column 201. Within the first column 201, the first chip contacts 126 of the first pixels 101 are connected with a first conductive path 221 along a first direction 241. In a second column 202, two first pixels 101 are arranged, as well, and the first pixels 101 are connected with a first conductive path 221.

Instead of a plurality of first pixels 101, a plurality of second pixels 102, a plurality of third pixels 103, a plurality of fourth pixels 104, a plurality of fifth pixels 105 or a plurality of sixth pixels 106 may also be arranged in the multi-pixel LED module 200. In such cases, a second conductive path may be provided to connect the second light-emitting semiconductor chips, a third conductive path may be provided to connect the third light-emitting semiconductor chips, and a fourth conductive path may be provided to connect the fourth light-emitting semiconductor chips.

In a first row 211 of first pixels 101, the adjacent first pixels 101 are connected to one another in such a way that a fifth conductive layer 175 connects a second contacting protrusion 152 to a first contacting protrusion along a second direction 242 perpendicular to first direction 241. This in total allows for a cross-matrix circuit of the first pixels 101.

Figure 13:
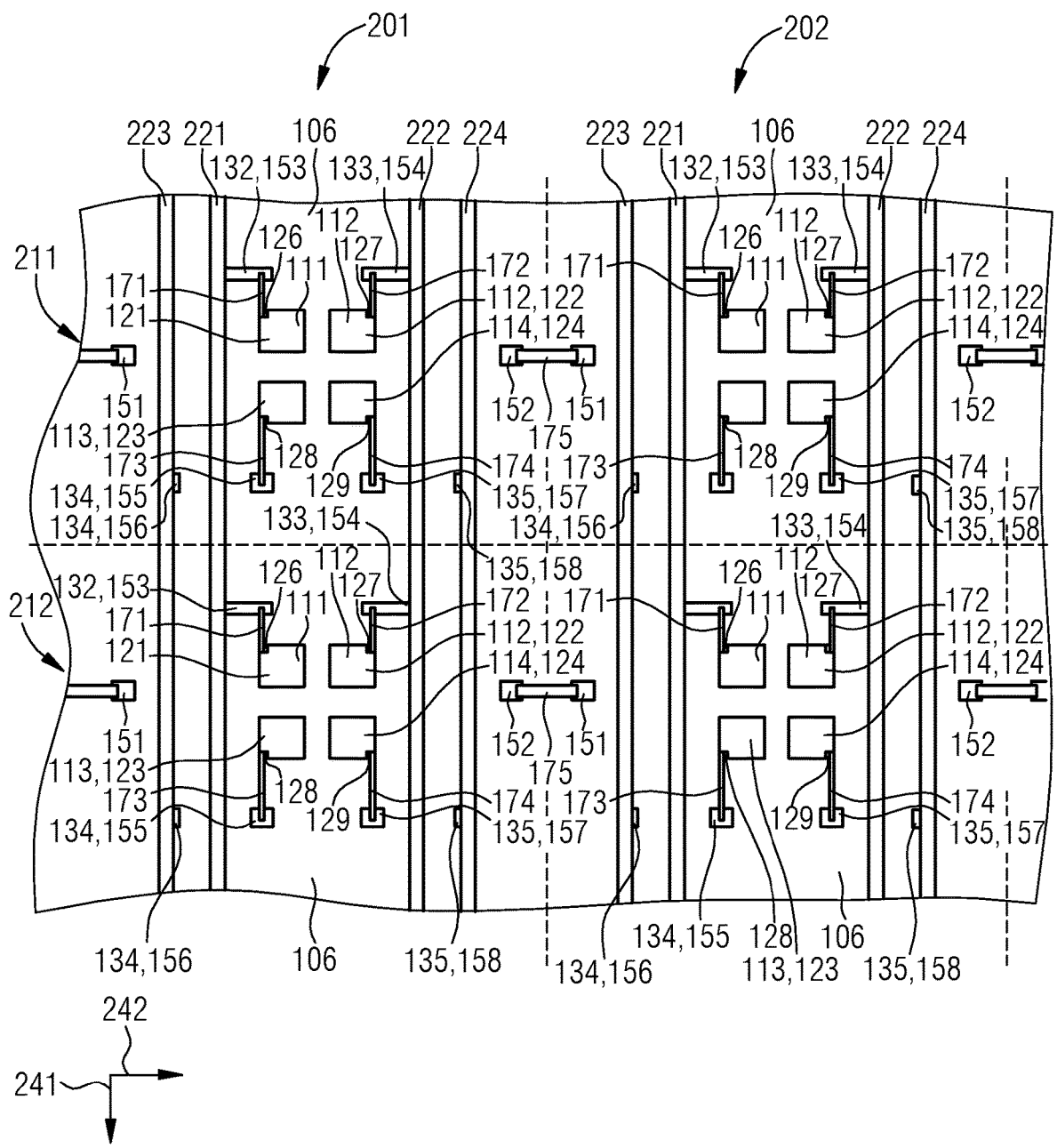
FIG. 13 shows a section of a multi-pixel LED module consisting of sixth pixels.

FIG. 13 shows a top view of a section of a multi-pixel LED module 200, which corresponds to the multi-pixel LED module 200 in FIG. 12, provided that no differences are described below. Instead of the first pixel 101 of FIG. 12, four sixth pixels 106 are arranged in a rectangle. The first conductive paths 221 are connected to the third contacting protrusions 153. Second conductive paths 222 are connected to the fourth contacting protrusions 154. Third conductive paths 223 are connected to the sixth contacting protrusions 156. Fourth conductive paths 224 are connected to the eighth contacting protrusions 158. The first paths 221 are arranged between the fifth contacting protrusion 155 and the sixth contacting protrusion 156 of the sixth pixel 106. The second paths 222 are arranged between the seventh contacting protrusion 157 and the eighth contacting protrusion 158 of the sixth pixel 106. This allows for the conductive paths 221, 222, 223, 224 to be guided over the sixth pixel 106 in such a way that no path crossings occur.

The conductive paths 221, 222, 223, 224 may in interconnection be arranged in such a way that after separating the multi-pixel LED module 200 into individual sixth pixels 106, no residues of the conductive paths 221, 222, 223, 224 remain visible from above. Thus, the individual sixth pixels 106 may be tested in the cross-matrix circuit of the multi-pixel LED module 200 and subsequently be separated into individual sixth pixels 106, wherein the individual sixth pixels 106 have a favorable optical impression. In the same way, first pixels 101, second pixels 102, third pixels 103, fourth pixels 104 and fifth pixels 105 from a corresponding multi-pixel LED module 200 may be separated after a functional test.

In the embodiment examples described so far, the light-emitting semiconductor chips 111, 112, 113, 114 are always arranged on the first lead-frame section 131. However, other arrangements are conceivable, as well, which also fall within the scope of embodiments. Furthermore, the light-emitting semiconductor chips 111, 112, 113, 114 may also be arranged in other geometric figures, for example in a triangle, in a rectangle or in a row.

Figure 14:
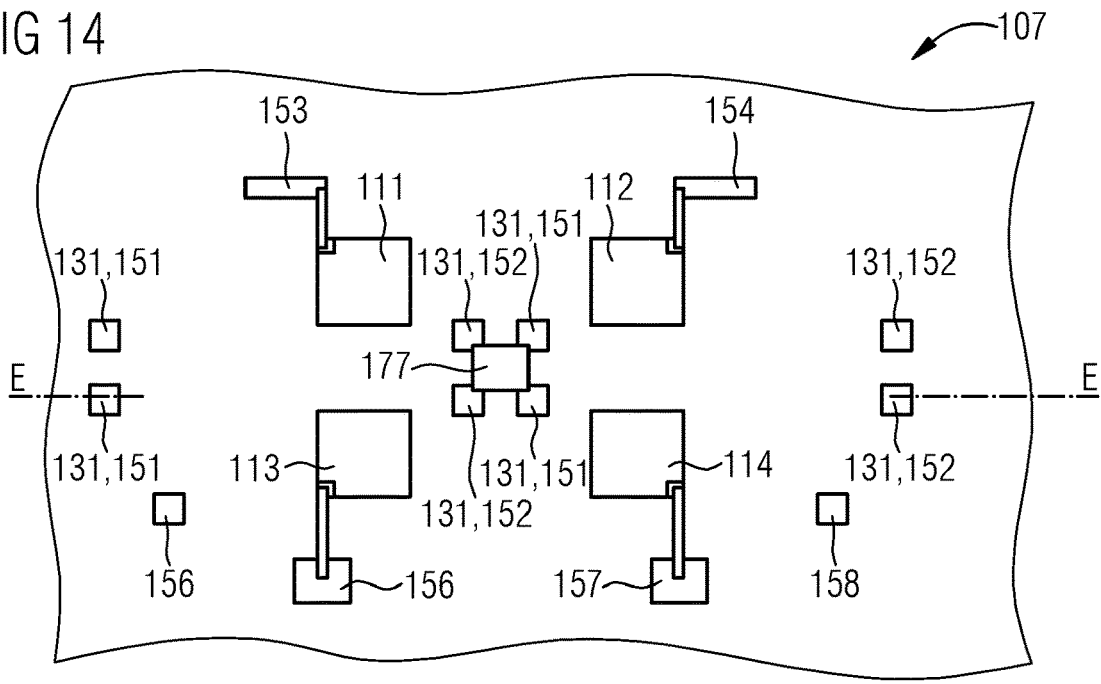
FIG. 14 shows a seventh pixel.

FIG. 14 shows a seventh pixel 107, which corresponds to the sixth pixel 106 of FIG. 10, unless differences are described below. Each light-emitting semiconductor chip 111, 112, 113, 114 is arranged on its own first lead-frame section 131, each of the four first lead-frame sections 131 having a first contacting protrusion 151 and a second contacting protrusion 152. Two first contacting protrusions 151 and two second contacting protrusions are arranged between the light-emitting semiconductor chips 111, 112, 113, 114, the contacting protrusions arranged between the light-emitting semiconductor chips 111, 112, 113, 114 being connected to one another via a central layer 177.

Moreover, it is also possible to provide two first lead-frame sections each having two light-emitting semiconductor chips 111, 112, 113, 114 or, for one of the other pixels 103, 104, 105, one first lead-frame section 131 per light-emitting semiconductor chip 111, 112, 113.

Figure 15:
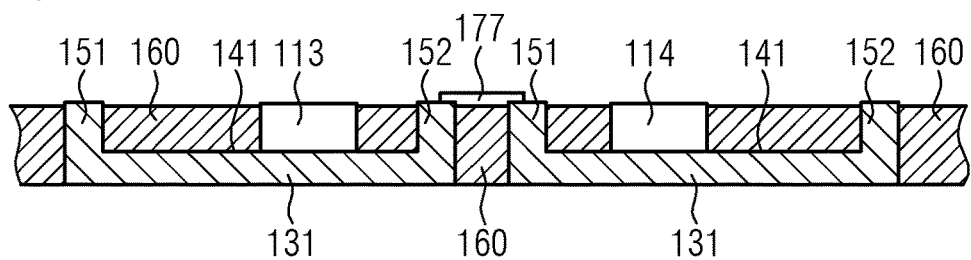
FIG. 15 shows a section through the seventh pixel.

FIG. 15 shows a cross-section through the seventh pixel 107 of FIG. 14 along the sectional line marked F. Between the first lead-frame sections 131, electrically insulating material 160 is arranged, with the center layer 177 connecting the first lead-frame sections 131.

Figure 16:
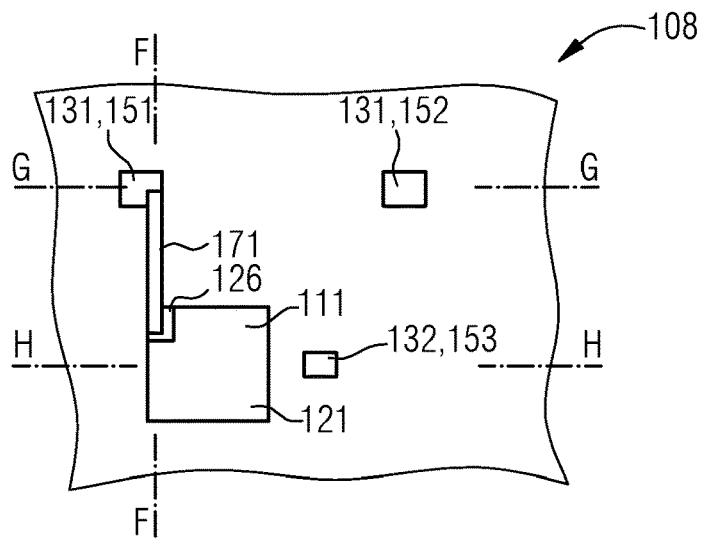
FIG. 16 shows an eighth pixel.

FIG. 16 shows a top view of an eighth pixel 108, which consists of a first light-emitting semiconductor chip 111 with a first upper chip side 121 and a first lead-frame section 131. The first lead-frame section 131 comprises a first contacting protrusion 151 and a second contacting protrusion 152. The first light-emitting semiconductor chip 111 is arranged on a second lead-frame section 132 having a third contacting protrusion 153. The first light-emitting semiconductor chip 111 is embedded in an electrically insulating material 160 in such a way that the first upper chip side 121 and the contacting protrusions 151, 152, 153 are exposed. The first contacting protrusion 151 is connected to a first chip contact 126 by means of a first conductive layer 171.

Figure 17:
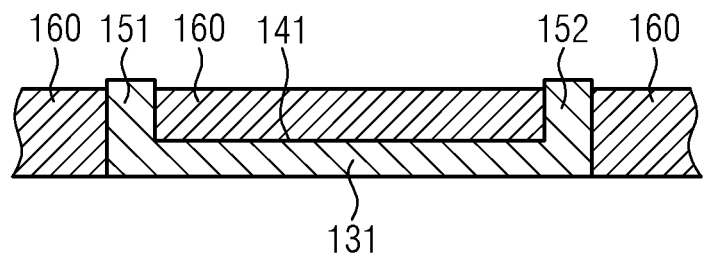
FIG. 17 shows a cross-section through the eighth pixel.

FIG. 17 shows a cross-section through the eighth pixel 108 of FIG. 16 along the sectional line marked G. The first lead-frame section 131 has a first upper side 141. The first contacting protrusion 151 and the second contacting protrusion 151 originate from the first upper side.

Figure 18:
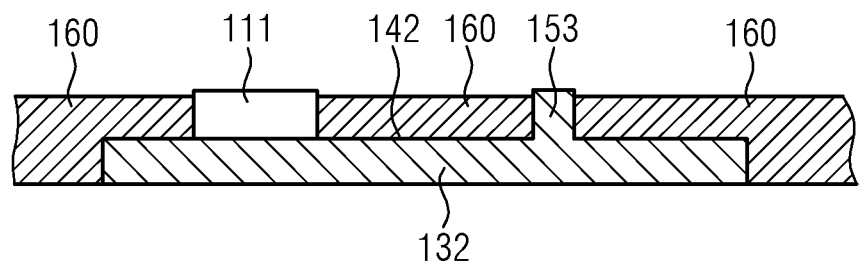
FIG. 18 shows another cross-section through the eighth pixel.

FIG. 18 shows a cross-section through the eighth pixel 108 of FIG. 16 along the sectional line marked H. The first light-emitting semiconductor chip 111 is positioned on a second upper side 142 of the second lead-frame section 132. The second lead-frame section 132 has a third contacting protrusion 153.

Figure 19:
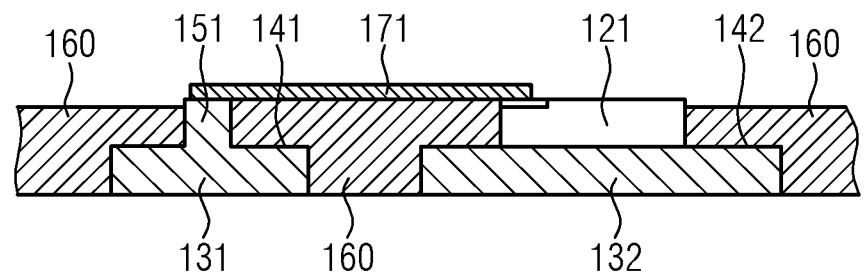
FIG. 19 shows another cross-section through the eighth pixel.

FIG. 19 shows a cross-section of the eighth pixel 108 of FIG. 16 along the sectional line marked I. The first upper chip side 121 is connected to the first contacting protrusion 151 by means of a first electrically conductive layer 171.

In order to produce a pixel 101, 102, 103, 104, 105, 106, 107, 108 or a multi-pixel LED module 200, a first lead-frame section 131 having a first upper side 141 and a first contacting protrusion 151 and a second contacting protrusion 152 may be provided first, the first contacting protrusion 151 and the second contacting protrusion 152 extending from the first upper side 141. Subsequently, a first light-emitting semiconductor chip 111 may be arranged on an upper side of a lead-frame section, for example the first upper side 141 of the first lead-frame section 131. The first light-emitting semiconductor chip has a first upper chip side 121. The first light-emitting semiconductor chip 111 may then be embedded in an electrically insulating material 160 in such a way that the first upper side 141 is covered by the electrically insulating material 160 and the first upper chip side 121 and the contacting protrusions 151, 152 are exposed.

Further lead-frame sections 132, 133, 134, 135 having further contacting protrusions 153, 154, 155, 156, 157, 158 may be provided, and/or further light-emitting semiconductor chips 112, 113, 114 may be arranged on the first upper side 141 and embedded in the electrically insulating material 160.

It may be provided that the light-emitting semiconductor chip 111 is placed on a second upper side 142 of a second lead-frame section 132.

To produce a multi-pixel LED module, additional pixels 101, 102, 103, 104, 105, 106, 107, 108 may be arranged in a first column 201 and a first conductive path 221 may be deposited on the electrically insulating material 160 along the first column 201, the first conductive path 221 being connected to the first upper chip sides 121.

Moreover, further columns 202 of pixels 101, 102, 103, 104, 105, 106, 107, 108 may be arranged adjacent to the first column 201 of pixels 101, 102, 103, 104, 105, 106, 107, 108 to form a multi-pixel LED module 200, wherein the first contacting protrusions 151 and the second contacting protrusions 152 are at least partially connected via fifth conductive layers 175, the fifth conductive layers 175 being arranged on the electrically insulating material 160.

Figure 20:
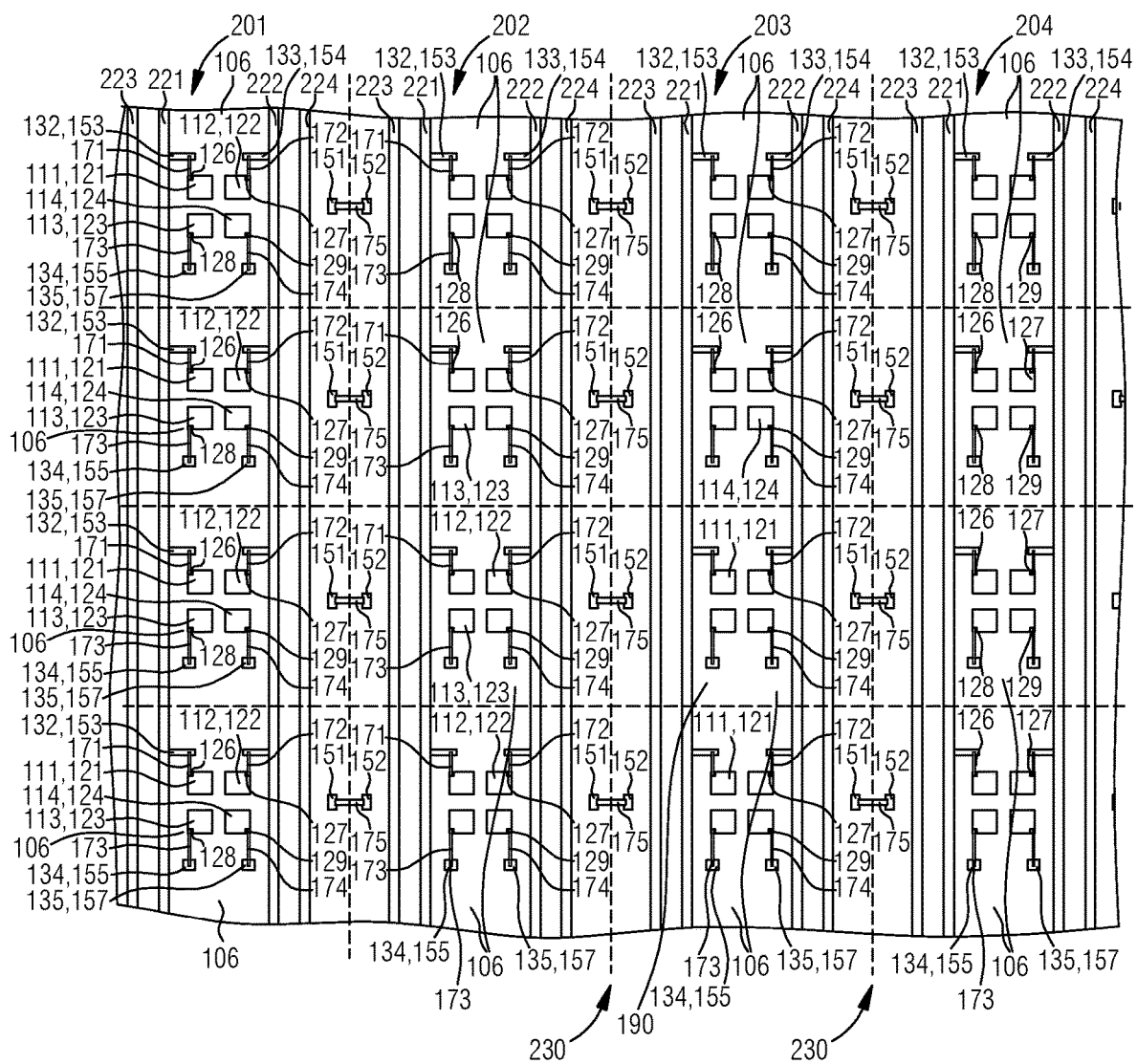
FIG. 20 shows a multi-pixel LED module with a defective pixel.

FIG. 20 shows a top view of a section of a multi-pixel LED module 200 during manufacture. Four columns 201, 202, 203, 204 and four rows 211, 212, 213, 214 of sixth pixels 106 are arranged. During a functional test, it may be determined that the pixel 106 located in the third column 203 and simultaneously in the second row 212 is a defective pixel 190. Now the third column 203 may be separated from the multi-pixel LED module 200 at the points marked with the arrows 230, for example by a saw cut.

Figure 21:
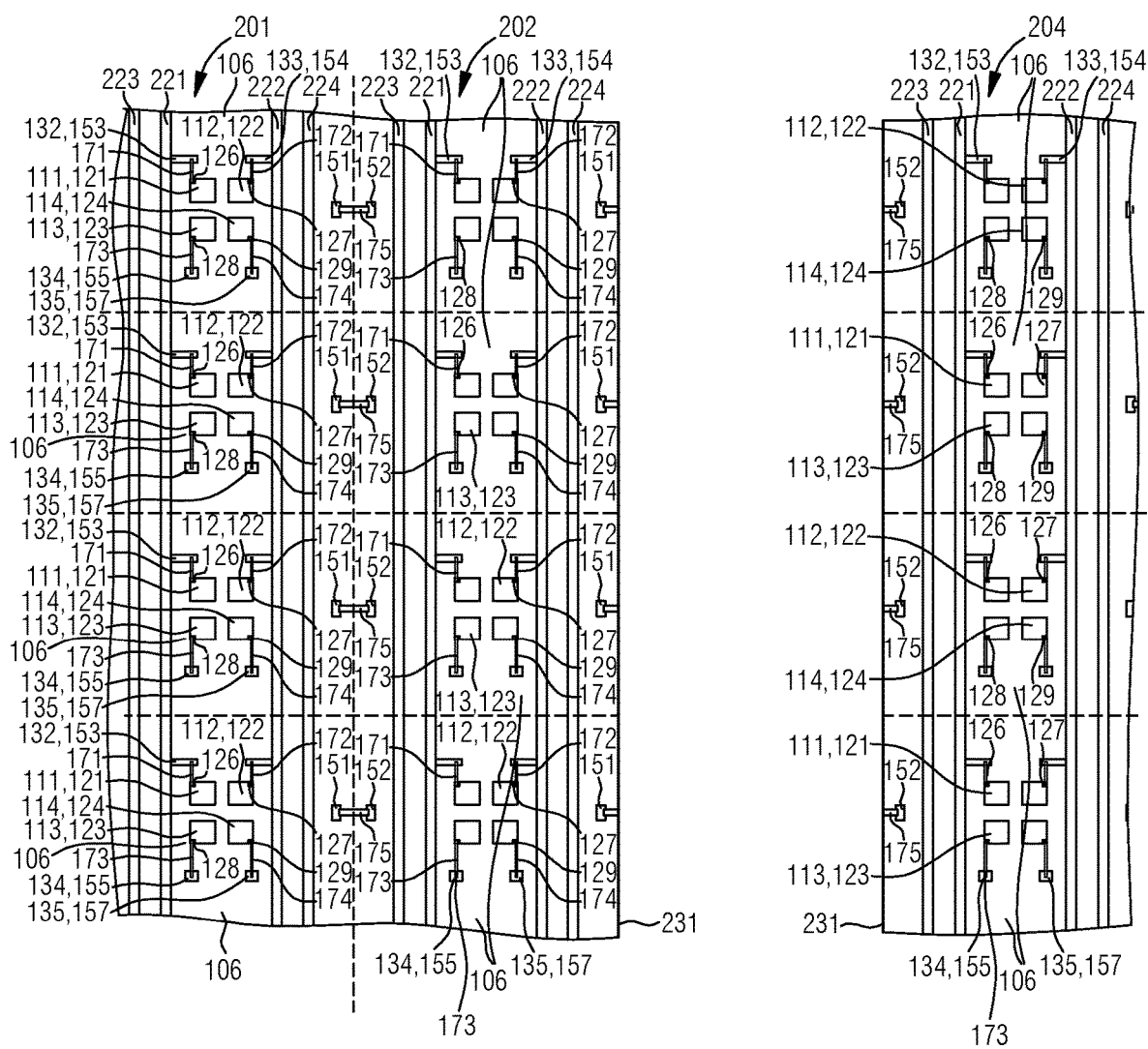
FIG. 21 shows a multi-pixel LED module in which a column of pixels with a defective pixel has been removed.

FIG. 21 shows a top view of the section of the multi-pixel LED module 200 of FIG. 20 after the third column 203 has been cut out. Separation points 231 are located at the edges of the removed third column 203.

Figure 22:
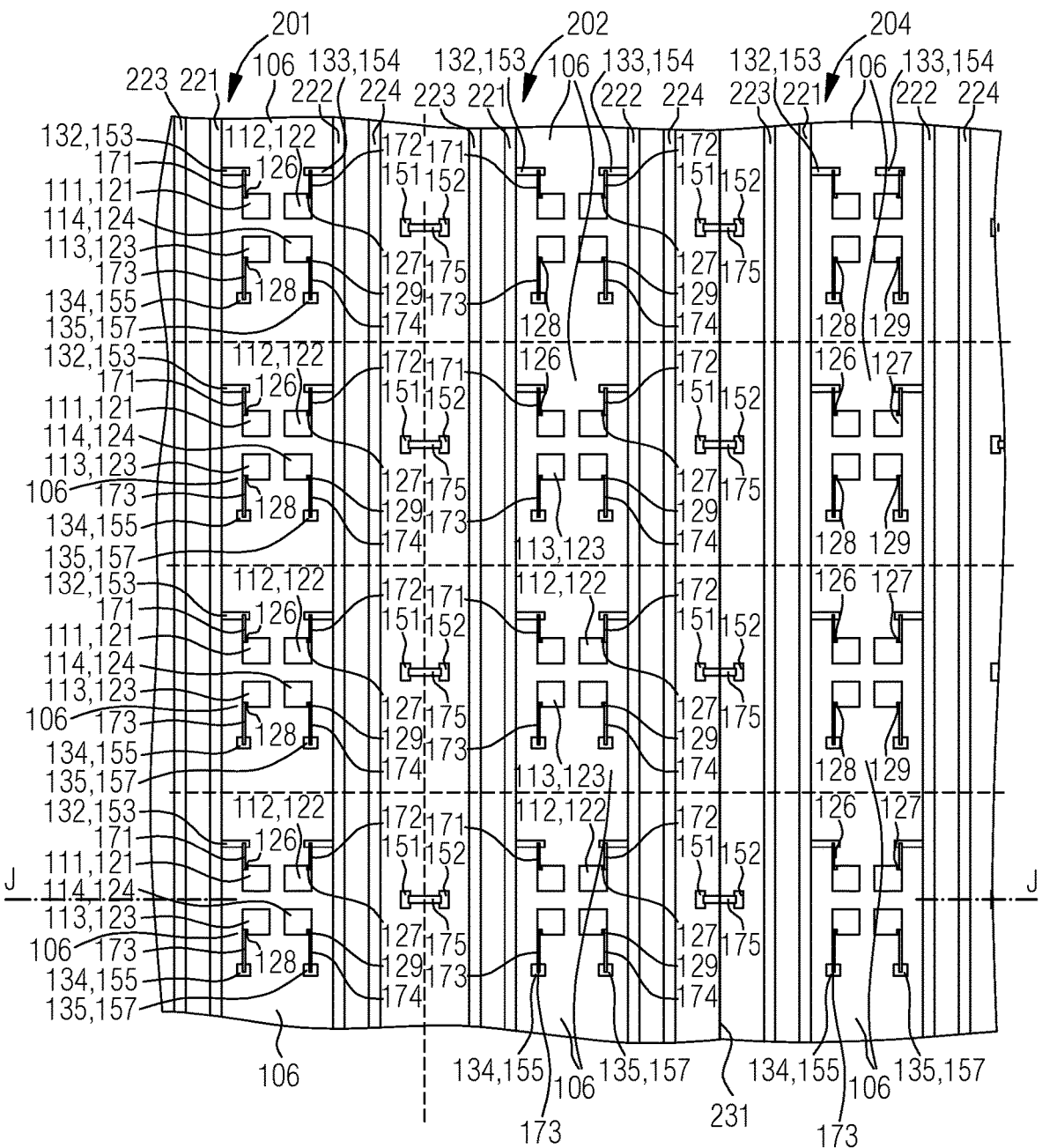
FIG. 22 shows a multi-pixel LED module in which a column of pixels with a defective pixel has been removed and electrical contacts have subsequently been restored.

FIG. 22 shows a top view of the cut-out of the multi-pixel LED module 200 of FIGS. 20 and 21 after the second column 202 and the fourth column 204 have been pushed together. The second column 202 and the fourth column 204 may e.g. be joined by gluing. Then the first lead-frame sections 131 of the second column 202 and of the fourth column 204 must be electrically connected to each other.

As an alternative to pushing the remaining columns 201, 202, 204 together as shown in FIG. 22, an independently produced third column 203 may also be inserted into the gap of the multi-pixel LED module 200. The electrical contact of the third column 203 is then carried out at the separation points 231.

Figure 23:
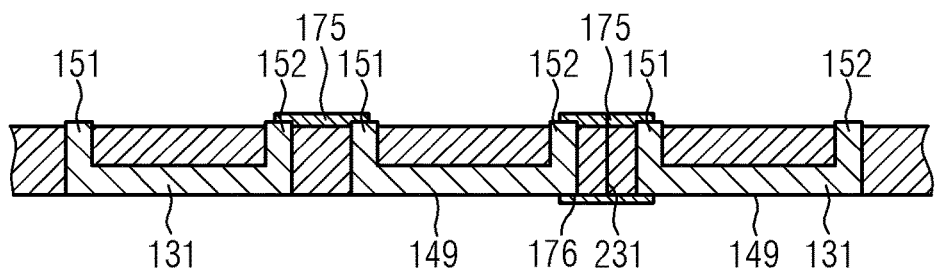
FIG. 23 shows a cross-section of a multi-pixel LED module in which a column of pixels with a defective pixel has been removed and electrical contacts have subsequently been restored.

FIG. 23 shows a cross-section through the multi-pixel LED module 200 of FIG. 22 along the sectional line marked I. At the separation point 231 it is not ensured that an electrical contact may be established via the cut-through fifth conductive layers 175. For this reason, a sixth conductive layer 176 may be deposited on the first upper sides 141 opposite to the bottom sides 149 of the first lead-frame sections 131 of the second column 202 and of the fourth column 204 to establish this contact. As an alternative to the sixth conductive layer 176, the contact may also be established by means of bonding wires or by a soldering process.

This process allows defective pixels 190 to be sorted out, thus considerably simplifying the manufacturing process. Starting from typical tile sizes for the multi-pixel LED module 200 of 16 by 12 pixels, a probability of a defective pixel 190 of 1 per thousand would mean that 17.5 percent of the tiles would have at least one defective pixel 190 and would thus have to be sorted out. If the tile is enlarged to 32 by 24 pixels, more than 53 percent of the tiles would already have a defective pixel. If an additional column of pixels is arranged in such a way that the tile contains 32 by 25 pixels, a good 80 percent of the tiles will have one or no defective pixel 190. Using the procedure shown in FIGS. 20 to 23, the column with the defective pixel 190 or, in the case that no pixel is defective, any column may be removed, and still a yield of over 80 percent of functioning tiles is obtained. This value is about the same as the size of the tile containing 16 by 12 pixels, so that much larger tiles may be reliably produced with only little effort. If further redundant columns are provided, even larger tiles may be produced with a good yield. For a tile containing 64×48 pixels as the final product, 5 additional columns, i.e. 64×53 pixels per tile produced, would lead to a yield of 89 percent without defects after carrying out the procedure in FIGS. 20 to 23. Compared to the known methods, this allows for a significantly more efficient production process.

The electrically conductive layers 171, 172, 173, 174, 175, 176 as well as the electrically conductive paths 221, 222, 223, 224 may be deposited on the electrically insulating material 160 by means of vapor deposition and/or electroplating and/or printing.

The lead-frame sections 131, 132, 133, 134, 135, 136, 137, 138 having contacting protrusions 151, 152, 153, 154, 155, 156, 156, 158 may be semi-etched lead-frame sections in which parts of a lead-frame section are covered with a photoresist by means of a lithographic mask and a subsequently applied acid was not able to attack the lead-frame section at these points, thereby forming the contacting protrusions 151, 152, 153, 154, 155, 156, 156, 158.

The connections of the first contacting protrusions 151 shown as the fifth conductive layer 175 having the second contacting protrusions 152 of the columns 201, 202, 203, 204 of pixels 101, 102, 103, 104, 105, 106, 107, 108 arranged next to one another may be carried out alternatively by means of bonding wire or by means of solder control windows. The first lead-frame sections 131 may also be continuously embodied in the second direction 242. At the borders of the pixels 101, 102, 103, 104, 105, 106, 107, 108 the continuous first lead-frame sections 131 may be sawn in from a bottom side.

Although the invention has been illustrated and described in detail by means of the preferred embodiment examples, the present invention is not restricted by the disclosed examples and other variations may be derived by the skilled person without exceeding the scope of protection of the invention.

The invention claimed is:

1. A pixel comprising:
a first light-emitting semiconductor chip having a first upper chip side;
a first lead-frame section,
wherein the first lead-frame section has a first upper side and a first contacting protrusion as well as a second contacting protrusion,
wherein the first contacting protrusion and the second contacting protrusion extend from the first upper side,
wherein the first light-emitting semiconductor chip is embedded in an electrically insulating material between the first contacting protrusion and the second contacting protrusion in such a way that the first upper side is covered by the electrically insulating material and the first upper chip side and the contacting protrusions are exposed, and
wherein the first light-emitting semiconductor chip is arranged on the first upper side; and
a second lead-frame section,
wherein the second lead-frame section has a second upper side and a third contacting protrusion extending from the second upper side,
wherein the electrically insulating material covers the second upper side, and
wherein a first conductive layer is arranged at the electrically insulating material such that the first conductive layer connects the first upper chip side to the third contacting protrusion.

2. The pixel of claim 1, wherein the first lead-frame section and the second lead-frame section are electrically insulated from each other so that the first light-emitting semiconductor chip is electrically contacted via the first lead-frame section and the second lead-frame section.

3. The pixel of claim 1, further comprising a second light-emitting semiconductor chip having a second upper chip side, the second light-emitting semiconductor chip being arranged on the first upper side and embedded in the electrically insulating material in such a way that the second upper chip side is exposed.

4. The pixel according to claim 3, further comprising a third lead-frame section, the third lead-frame section having a third upper side and a fourth contacting protrusion extending from the third upper side, the third upper side being covered by the electrically insulating material and a second conductive layer being deposited to the electrically insulating material in such a way that the second conductive layer connects the second upper chip side to the fourth contacting protrusion.

5. The pixel according to claim 2, further comprising a third light-emitting semiconductor chip having a third upper chip side and a fourth lead-frame section, the third light-emitting semiconductor chip being arranged on the first upper side, wherein the fourth lead-frame section has a fourth upper side and a fifth contacting protrusion as well as a sixth contacting protrusion, and wherein the fourth upper side is covered by the electrically insulating material and a third conductive layer is deposited to the electrically insulating material in such a way that the third conductive layer connects the third upper chip side to the fifth contacting protrusion.

6. The pixel according to claim 5, further comprising a fourth light-emitting semiconductor chip having a fourth upper chip side and a fifth lead-frame section, the fourth light-emitting semiconductor chip being arranged on the first upper side, the fifth lead-frame section having a fifth upper side and a seventh contacting protrusion as well as an eighth contacting protrusion, wherein the fifth upper side is covered by the electrically insulating material and a fourth conductive layer is applied to the electrically insulating material in such a way that the fourth conductive layer connects the fourth upper chip side to the seventh contacting protrusion.

7. The pixel of claim 1, wherein the first light-emitting semiconductor chip is arranged on the second upper side of the second lead-frame section, and wherein the first upper chip side is connected to the first contacting protrusion by means of a first electrically conductive layer.

8. A multi-pixel LED module comprising:
a first column of pixels according to claim 1 arranged in a first direction; and
a first conductive path is continuously guided along the first direction across the first column of pixels,
wherein the first conductive path is connected to the first light-emitting semiconductor chip.

9. The multi-pixel LED module according to claim 8, wherein the first conductive path is arranged between the first contacting protrusions and the second contacting protrusions.

10. The multi-pixel LED module according to claim 9, further comprising further columns of pixels arranged in the first direction, which are identical to the first column of pixels, wherein the first contacting protrusions and the second contacting protrusions are at least partially connected via fifth conductive layers, and wherein the fifth conductive layers are arranged on the electrically insulating material.

11. The multi-pixel LED module according to claim 10, wherein between two columns of pixels the first lead-frame sections of the pixels are each interconnected via a sixth conductive layer, and wherein the sixth conductive layers are arranged on a bottom side of the first lead-frame sections opposite to the first upper sides.

12. A method for producing the pixel according to claim 1, the method comprising:
providing the first lead-frame section;
providing the second lead-frame section;
arranging the first light-emitting semiconductor chip on the first upper side of the first lead-frame section; and
embedding the first light-emitting semiconductor chip in the electrically insulating material such that the first upper side is covered by the electrically insulating material and the first upper chip side and the contacting protrusions are exposed.

13. The method according to claim 12, wherein further lead frame sections having further contacting protrusions are provided, and/or further light-emitting semiconductor chips are arranged on the first upper side and embedded in the electrically insulating material.

14. The method according to claim 12, wherein further pixels are arranged in a first column, and a first conductive path is deposited to the electrically insulating material along the first column, the first conductive path being connected to the first upper chip sides.

15. The method according to claim 14, wherein further columns of pixels are arranged adjacent to the first column to form a multi-pixel LED module, wherein the first contacting protrusions and the second contacting protrusions are at least partially connected via fifth conductive layers, and wherein the fifth conductive layers are arranged on the electrically insulating material.

16. The method according to claim 15, wherein defective pixels are identified via a test procedure, wherein a column of pixels containing a defective pixel is removed from the multi-pixel LED module, thereby forming a separation point, wherein the remaining columns of the multi-pixel LED module are pushed together, and wherein the first lead-frame sections of the columns at the separation point are in each case interconnected by a sixth conductive layer.

17. A multi-pixel LED module comprising:
    a first column of pixels arranged in a first direction, each pixel comprising:
        a first light-emitting semiconductor chip having a first upper chip side; and
        a first lead-frame section having a first upper side, a first contacting protrusion and a second contacting protrusion,
    wherein the first upper side extends continuously between the first contacting protrusion and the second contacting protrusion,
    wherein the first contacting protrusion and the second contacting protrusion extend from the first upper side,
    wherein the first light-emitting semiconductor chip is embedded in an electrically insulating material such that the first upper side is covered by the electrically insulating material and the first upper chip side and the contacting protrusions are exposed,
    wherein a first chip contact of the first light-emitting semiconductor chip is connected with a first conductive path along the first direction,
    wherein the first conductive path is arranged on top of the electrically insulating material, and
    wherein the first conductive path is continuously guided along the first direction across the first column of pixels.

18. The multi-pixel LED module according to claim 17, wherein the first conductive path is arranged between the first contacting protrusions and the second contacting protrusions.

19. A method for producing multi pixel LED module according to claim 17, the method comprising:
    providing the first lead-frame section including the first upper side, the first contacting protrusion and the second contacting protrusion, the first contacting protrusion and the second contacting protrusion extending from the first upper side;
    arranging the first light-emitting semiconductor chip on the first upper side of the first lead-frame section, wherein the first light-emitting semiconductor chip comprises the first upper chip side;
    embedding the first light-emitting semiconductor chip in the electrically insulating material such that the first upper side is covered by the electrically insulating material and the first upper chip side and the contacting protrusions are exposed;
    arranging further pixels in the first column; and
    disposing the first conductive path to the electrically insulating material along the first column, the first conductive path being connected to the first upper chip sides.

* * * * *